(12) United States Patent
Hwang et al.

(10) Patent No.: US 9,214,223 B2
(45) Date of Patent: Dec. 15, 2015

(54) RESISTANCE MEMORY DEVICE AND MEMORY APPARATUS AND DATA PROCESSING SYSTEM

(71) Applicant: SK HYNIX INC., Icheon (KR)

(72) Inventors: Hyun Mi Hwang, Icheon (KR); Hyung Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 157 days.

(21) Appl. No.: 13/971,069

(22) Filed: Aug. 20, 2013

(65) Prior Publication Data
US 2014/0169067 A1 Jun. 19, 2014

(30) Foreign Application Priority Data

Dec. 18, 2012 (KR) .................. 10-2012-0148667

(51) Int. Cl.
*G11C 11/00* (2006.01)
*G11C 13/00* (2006.01)
*H01L 45/00* (2006.01)
*H01L 41/09* (2006.01)
*G11C 23/00* (2006.01)

(52) U.S. Cl.
CPC ........ *G11C 13/0002* (2013.01); *G11C 13/0007* (2013.01); *H01L 41/0986* (2013.01); *H01L 45/08* (2013.01); *H01L 45/085* (2013.01); *H01L 45/12* (2013.01); *H01L 45/1233* (2013.01); *H01L 45/146* (2013.01); *G11C 13/0069* (2013.01); *G11C 23/00* (2013.01); *G11C 2013/0083* (2013.01); *G11C 2013/0095* (2013.01); *G11C 2213/32* (2013.01)

(58) Field of Classification Search
CPC .......... G11C 13/0069; G11C 13/0004; G11C 13/0007
USPC .................. 365/148, 158, 171, 173
See application file for complete search history.

(56) References Cited

U.S. PATENT DOCUMENTS

| | | | |
|---|---|---|---|
| 7,247,510 B2 * | 7/2007 | Ito et al. ........................ | 438/73 |
| 7,283,386 B2 * | 10/2007 | Shin et al. ..................... | 365/158 |
| 7,876,603 B2 * | 1/2011 | Liu et al. ...................... | 365/158 |
| 8,199,576 B2 * | 6/2012 | Fasoli et al. .............. | 365/185.13 |
| 2002/0017675 A1 | 2/2002 | Tanaka | |

FOREIGN PATENT DOCUMENTS

KR 10-2003-0046296 A 6/2003

* cited by examiner

*Primary Examiner* — Son Dinh

(57) ABSTRACT

A resistance memory device and a memory apparatus and data processing apparatus having the same are provided. The resistance memory device includes a pair of electrode layers and a variable resistance layer interposed between the pair of electrode layers. The variable resistance layer includes at least one variable resistance material layer and a piezoelectric material layer coupled to the at least one variable resistance material layer.

19 Claims, 6 Drawing Sheets

RESISTANCE MEMORY DEVICE AND MEMORY APPARATUS AND DATA PROCESSING SYSTEM

CROSS-REFERENCE TO RELATED APPLICATION

The present application claims priority under 35 U.S.C. 119(a) to Korean application number 10-2012-0148667, filed on Dec. 18, 2012, in the Korean Intellectual Property Office, which is incorporated herein by reference in its entirety.

BACKGROUND

1. Technical Field

Embodiments relate to a semiconductor integrated device, and more particularly, to a resistance memory device and a memory apparatus and a data processing system having the same.

2. Related Art

Resistance memory devices are device using current transfer characteristics of a variable resistance material according to an applied voltage and include phase-change random access memories (PRAMs), resistive RAMs (ReRAMs), and the like.

The ReRAMs are generally fabricated in a metal-insulator-metal (MIM) structure using transition metal oxide (TMO) as the insulator. The ReRAMs operate at high speed of about 10 to 20 ns and at a low voltage. Further, since the ReRAMs perform a switching operation by locally forming filaments, it can be formed under a relatively tight critical dimension (CD) condition.

FIG. 1 is a view illustrating a structure of a general resistance memory device.

As illustrated in FIG. 1, a resistance memory device 10 has a structure in which a first electrode layer 11, a variable resistance material layer 15, and a second electrode layer 13 are stacked.

The first and second electrodes 11 and 13 may be formed, for example, using titanium nitride TiN. The variable resistance material layer 15 may be formed using metal oxide, for example, titanium oxide ($Ti_xO_y$) (x and y are integers) such as $TiO_2$ or $TiO_{2-x}$.

Transition metal oxide employed for the resistance memory devices has a long lifespan due to good endurance and improves device reliability due to good on/off characteristic and data retention characteristic. However, current resistance memory devices may have a high operation voltage range of −3 V to +3V and also have high operation current of ±50 μA.

The high voltage and high current characteristics causes power consumption to be increased and thus there is a need for resistance memory devices having low current/voltage characteristics.

SUMMARY

According to one aspect of an exemplary embodiment, there is provided a resistance memory device. The resistance memory device may include: a pair of electrode layers; a pair of electrode layers; and a variable resistance layer interposed between the pair of electrode layers, the variable resistance layer including, at least one variable resistance material layer, and a piezoelectric material layer coupled to the at least one variable resistance material layer.

According to another aspect of an exemplary embodiment, there is provided a memory apparatus. The memory apparatus may include: a memory cell array including a plurality of memory cells connected between word lines and bit lines; and a controller configured to control data write/read operation for a selected memory cell of the memory cell array, wherein the plurality of memory cells includes a resistance memory device, wherein the resistance memory device includes: a pair of electrode layers; and a variable resistance layer interposed between the pair of electrode layers and including at least one variable resistance material layer and a piezoelectric material layer coupled to the at least one variable resistance material layer.

According to another aspect of an exemplary embodiment, there is provided a data processing system. The data processing system may include: a resistance memory apparatus; and a memory controller configured to access the resistance memory apparatus in response to demand of a host. The resistance memory apparatus may include: a memory cell array and a controller configured to control an operation of the memory cell array, wherein the memory cell array includes a plurality of memory cells, wherein the plurality of memory cells are connected between word lines and bit lines, each of the plurality of memory cells including a resistance memory device. The resistance memory device may include a pair of electrode layers and a variable resistance layer interposed between the pair of electrode layers, and wherein the variable resistance layer includes at least one variable resistance material layer and a piezoelectric material layer coupled to the at least one variable resistance material layer.

According to another aspect of an exemplary embodiment, there is provided a data processing system. The data processing system may include: a processor configured to control an overall operation; an operation memory configured to store data; a resistance memory apparatus accessible by the processor; and an input/output device configured to input/output data between the processor and a user. The resistance memory apparatus may include a memory cell array and a controller configured to control an operation of the memory cell array, wherein the memory cell array includes memory cells connected between word lines and bit lines, wherein each of the memory cells includes a resistance memory device. The resistance memory device may include a pair of electrode layers and a variable resistance layer interposed between the pair of electrode layers, and wherein the variable resistance layer includes at least one variable resistance material layer and a piezoelectric material layer coupled to at least one variable resistance material layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
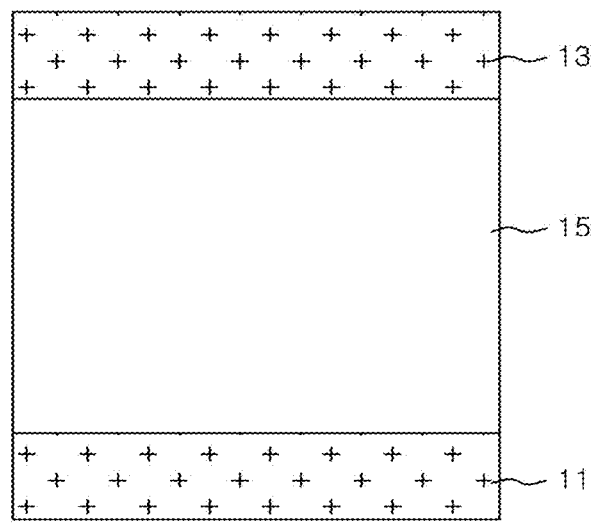
FIG. 1 is a view illustrating a structure of a general resistance memory device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 2 to 6 are views illustrating structures of resistance memory devices according to exemplary embodiments.

Each of resistance memory devices illustrated in FIGS. 2 to 6 is configured to include (i) at least one variable resistance material layers 25-2, 351-1 and 35n-2, 45-1 and 45-3, 551, 554-m, and 552, and 65-2, and (i) a piezoelectric material layer 25-1, 351-2 and 35n-1, 45-2, 553-1, 553-m, and 553-(m+1), and 65-1 and 65-3 formed over the variable resistance material layer 25-2, 351-1 and 35n-2, 45-1 and 45-3, 551, 554-m, and 552, and 65-2. A stack of the variable resistance material layer(s) and the piezoelectric material layer(s) is disposed between a pair of electrode layers 21 and 23, 31 and 33, 41 and 43, 51 and 53, and 61 and 63.

Here, each of the pair of electrode layers 21 and 23, 31 and 33, 41 and 43, 51 and 53, and 61 and 63 may be formed, for example, using TiN and each of the variable resistance material layers 25-2, 351-1 and 35n-2, 45-1 and 45-3, 551, 554-m, and 552, and 65-2 may be formed using metal oxide, for example, $Ti_xO_y$, such $TiO_2$ or $TiO_{2-x}$ (where, x, y are integers).

The piezoelectric material is a material which may convert mechanical energy into electrical energy, or electrical energy into mechanical energy. An embodiment uses a reverse piezoelectric effect in which a piezoelectric material is expanded and contracted according to an applied voltage.

In an exemplary embodiment, the piezoelectric material may include a material which is non-reactive with a material forming the variable resistance material layer 25-2, 351-1 and 35n-2, 45-1 and 45-3, 551, 554-m, and 552, and 65-2. For example, the piezoelectric material may be a Perovskite-based material such as $Pr0:7Ca0:3MnO_3$ (PCMO), $SrTiO_3$ (STO), $Pb[Zr_xTi_{1-x}]O_3$ (0≤x≤1) (PZT), barium titanate (BaTiO_3), etc. The piezoelectric material may be ferroelectric piezoelectric materials such as $SBT(SrBi_2Ta_2O_9)$, $BLT((Bi,La)_4Ti_3O_{12})$, etc., but the piezoelectric material is not limited thereto.

Each of the piezoelectric material layers 25-1, 351-2 and 35n-1, 45-2, 553-1, 553-m, and 553-(m+1), and 65-1 and 65-3 may be formed so that contraction occurs at an interface between each of the variable resistance material layers 25-2, 351-1 and 35n-2, 45-1 and 45-3, 551, 554-m, and 552, and 65-2, and each of the variable resistance material layers 25-2, 351-1 and 35n-2, 45-1 and 45-3, 551, 554-m, and 552, and 65-2. That is, when current is applied to each of the piezoelectric material layers 25-1, 351-2 and 35n-1, 45-2, 553-1, 553-m, and 553-(m+1), and 65-1 and 65-3, warpage occurs in each of the piezoelectric material layers 25-1, 351-2 and 35n-1, 45-2, 553-1, 553-m, and 553-(m+1), and 65-1 and 65-3. A kind, composition, and formation method of each of the piezoelectric material layers 25-1, 351-2 and 35n-1, 45-2, 553-1, 553-m, and 553-(m+1), and 65-1 and 65-3, and a current direction are selected so that contraction occurs in a contact interface between each of the variable resistance material layers 25-2, 351-1 and 35n-2, 45-1 and 45-3, 551, 554-m, and 552, and 65-2 and each of the piezoelectric material layers 25-1, 351-2 and 35n-1, 45-2, 553-1, 553-m, and 553-(m+1), and 65-1 and 65-3. Therefore, resistance in one side of each of the variable resistance material layers 25-2, 351-1 and 35n-2, 45-1 and 45-3, 551, 554-m, and 552, and 65-2, which is in contact with each of the piezoelectric material layers 25-1, 351-2 and 35n-1, 45-2, 553-1, 553-m, and 553-(m+1), and 65-1 and 65-3, is increased, and the other side of each of the variable resistance material layers 25-2, 351-1 and 35n-2, 45-1 and 45-3, 551, 554-m, and 552, and 65-2 is tensioned and thus resistance in the other side is reduced. Therefore, an effective resistance thickness of each of the variable resistance material layers 25-2, 351-1 and 35n-2, 45-1 and 45-3, 551, 554-m, and 552, and 65-2 is reduced.

Thus, the reduction in the effective resistance thickness of each of the variable resistance material layers 25-2, 351-1 and 35n-2, 45-1 and 45-3, 551, 554-m, and 552, and 65-2 causes reduction in a forming voltage having the highest level in an operation of the resistance memory device.

Further, when filaments are formed after forming, current flows, shrinkage stress is applied to the filaments, and thus rapid change in characteristics of the filaments is caused. This is because when an effective area in which electrons or ions move is reduced, a moving path is reduced or scattering is increased, a band gap (activation energy) is increased, and thus penetration of the electrons or ions is not easy. Therefore, write nonlinearity in an on-state condition of transition from a high-resistance condition to a low-resistance condition is increased and thus the high-resistance and the low-resistance are clearly distinguished, so that reliability of the memory device may be improved.

On the other hand, when the resistance in the one side of each of the variable resistance material layers 25-2, 351-1 and 35n-2, 45-1 and 45-3, 551, 554-m, and 552, and 65-2, which is in contact with each of the piezoelectric material layers 25-1, 351-2 and 35n-1, 45-2, 553-1, 553-m, and 553-(m+1), and 65-1 and 65-3, is increased, movement of the electrons or ions at the interface is not easy, the forming is made at a small voltage, and thus the number of formed filaments is reduced. Therefore, a reset current is reduced due to increase in the on-resistance and the total power consumption may be remarkably reduced.

The structures of the resistance memory devices according to various exemplary embodiments will be described below.

Figure 2:
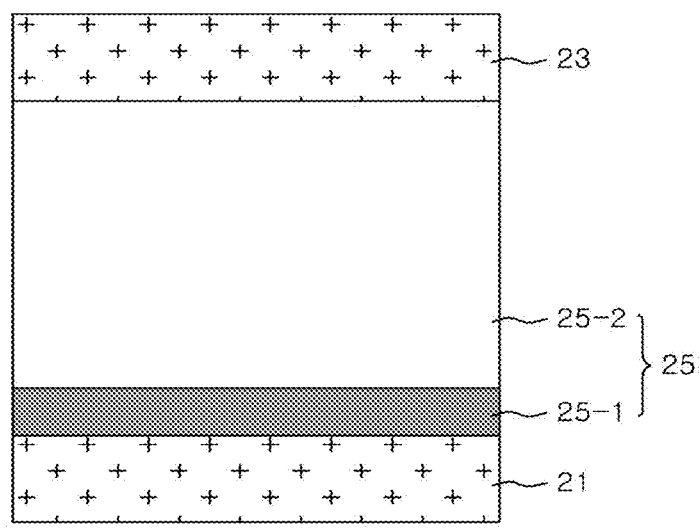
FIGS. 2 to 6 are views illustrating structures of resistance memory devices according to exemplary embodiments.

First, the resistance memory device 20 as illustrated in FIG. 2 includes the pair of electrode layers 21 and 23, and a variable resistance layer 25 including the piezoelectric material layer 25-1 and a variable resistance material layer 25-2 disposed between the pair of electrode layers 21 and 23.

Figure 3:
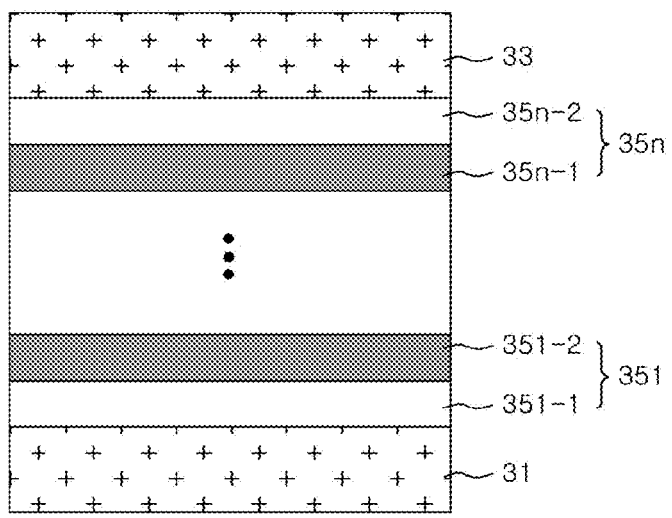

FIG. 3 illustrates a resistance memory device 30 according to another exemplary embodiment. The resistance memory device 30 illustrated in FIG. 3 includes a plurality of variable resistance layer 351 through 35n (n is integer) disposed between the pair of electrode layers 31 and 33. Each of the variable resistance layers 351 through 35n forms a stacked structure with the piezoelectric material layer 351-2 and 35n-1 and the variable resistance material layer 351-1 and 35n-2.

Figure 4:
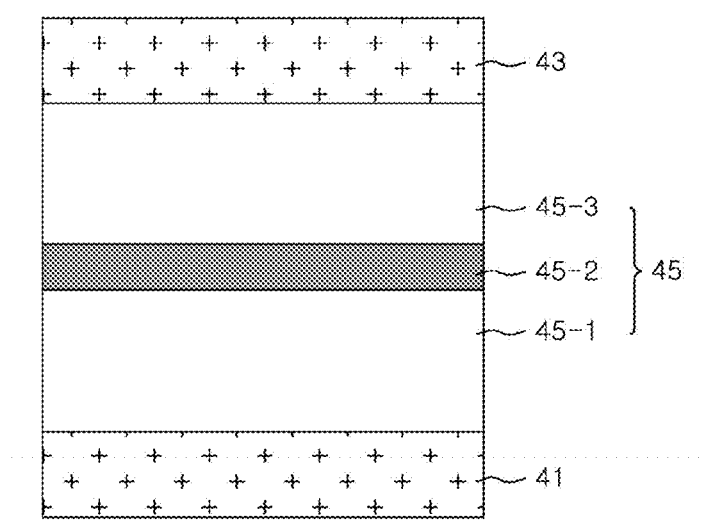

FIG. 4 illustrates a resistance memory device 40 according to another exemplary embodiment. In a resistance memory device 40 illustrated in FIG. 4, a variable resistance layer 45 has a stack of (i) a first variable resistance material layer 45-1, (ii) the piezoelectric material layer 45-2, and (iii) a second variable resistance material layer 45-3 which are sequentially stacked. The stack is interposed between the pair of electrode layers 41 and 43.

Figure 5:
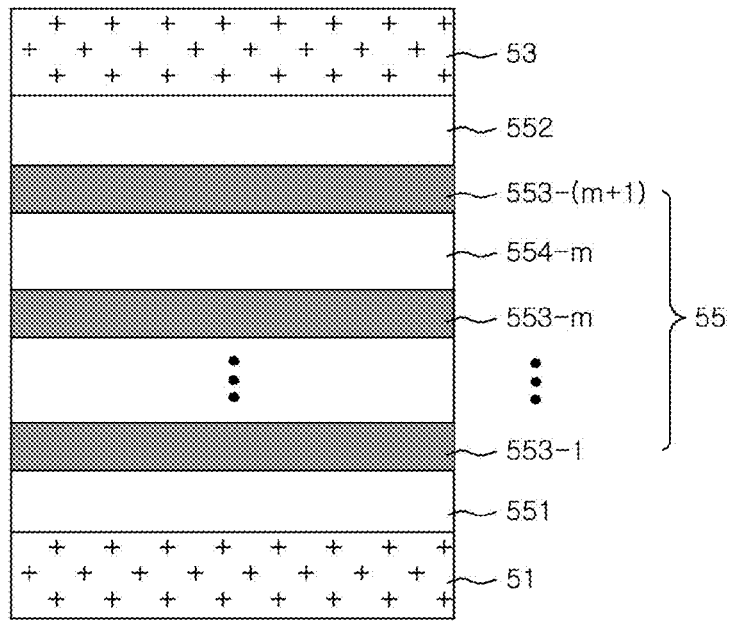

FIG. 5 illustrates a resistance memory device 50 according to another exemplary embodiment. The resistance memory device 50 illustrated in FIG. 5 may include a pair of electrode layers 51 and 53 and a stack of (i) a first variable resistance layer 551, (ii) a second variable resistance layer 55, and (iii) a third variable resistance layer 552. The stack is interposed between the pair of electrode layers 51 and 53.

Here, the first variable resistance layer 551 and the third variable resistance layer 552 may be formed of a variable resistance material used for a general resistance memory device. The second variable resistance layer 55 may have a stacked structure of (i) the piezoelectric material layers 553-1, 553-m, and 553-(m+1) and (ii) the variable resistance material layer 554-m.

Figure 6:
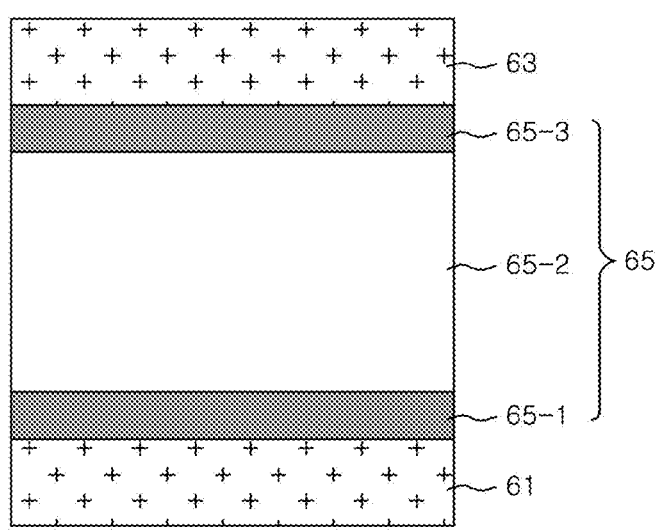

In another exemplary embodiment, a resistance memory device 60 illustrated in FIG. 6 may include a pair of electrode layers 61 and 63 and a variable resistance layer 65 interposed between the pair of electrode layers 61 and 63. The variable resistance layer 65 may have a stacked structure of (i) a first piezoelectric material layer 65-1, (ii) a variable resistance material layer 65-2, and (iii) a second piezoelectric material layer 65-3.

As illustrated in FIGS. 3 to 6, the plurality of variable resistance material layers are introduced into the resistance memory devices. The variable resistance material layers may be formed using the same material, using materials which are same in components but different in a composition ratio from each other, or using different materials from each other. Similarly, a plurality of piezoelectric material layers are introduced into the resistance memory device, the plurality of piezoelectric material layers may be formed using the same material, using materials which are the same in components but different in a composition ratio from each other, or using different materials from each other.

Figure 7:
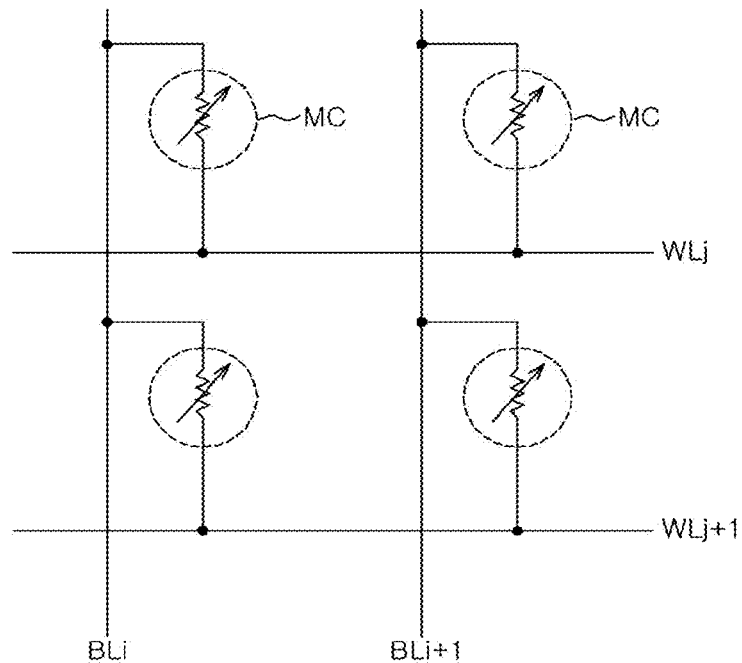
FIGS. 7 and 8 are views explaining configurations of resistance memory cell arrays according to exemplary embodiments.
Figure 8:
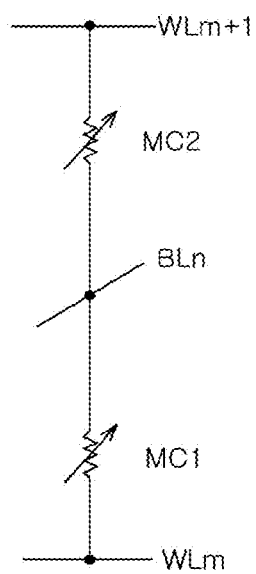

FIGS. 7 and 8 are views illustrating structures of resistance memory cell arrays according to exemplary embodiments.

First, FIG. 7 illustrates an array structure including memory cells formed between a plurality of bit lines BLi and BLi+1 and a plurality of word lines WLj and WLj+1.

As illustrated in FIG. 7, the memory cell array may be configured to form resistance memory devices MC between the bit lines BLi and BLi+1 and the word lines WLj and WLj+1. Each of the resistance memory devices MC may adopt any one of the structures of the resistance memory devices illustrated in FIGS. 2 to 6, but the structure of the resistance memory cell MC is not limited thereto. Any structure which includes a stack of (i) at least one variable resistance material layer and (ii) a piezoelectric material layer disposed on at least one side of the variable resistance material layer may be selected and introduced between a pair of electrode layers.

FIG. 7 illustrates the memory cell array not using a selection device, but the selection device such as a transistor or a diode may be further added between the resistance memory cell MC and each of the word line WLj and WLj+1.

FIG. 8 illustrates a memory cell array having a crossbar array structure.

In the crossbar array structure, the resistance memory devices MC1 and MC2 which are unit memory cells may be formed to have a symmetric structure with respect to a bit line BL. That is, the resistance memory devices MC1 and MC2 may be fabricated so that a single electrode can serve as both of an upper electrode of a lower resistance memory device MC1 and a lower electrode of an upper resistance memory device MC2 and thus the resistance memory devices MC1 and MC2 share the single electrode.

The crossbar array structure is not limited to the symmetric structure, and the crossbar array structure may be formed by sequentially stacking resistance memory devices having the same structure.

The reference numerals WLm and WLm+1 denote word lines.

FIG. 8 has illustrated that the unit memory cell includes only the resistance memory devices MC1 and MC2, but the unit memory cell is not limited thereto. The unit memory cell may be configured to connect each of the resistance memory devices MC1 and MC2 to a selection device in series.

The memory cell array illustrated in FIG. 8 may adopt any one of the structures of the resistance memory devices illustrated in FIGS. 2 to 6 as the resistance memory devices MC1 and MC2, but the memory cell array is not limited thereto. The memory cell array may adopt any structure which includes (i) a stack of at least one variable resistance material layer and a piezoelectric material layer disposed on at least one side of the at least one variable resistance material layer and (ii) a pair of electrode layers. The stack is formed between the pair of electrode layers.

Figure 9:
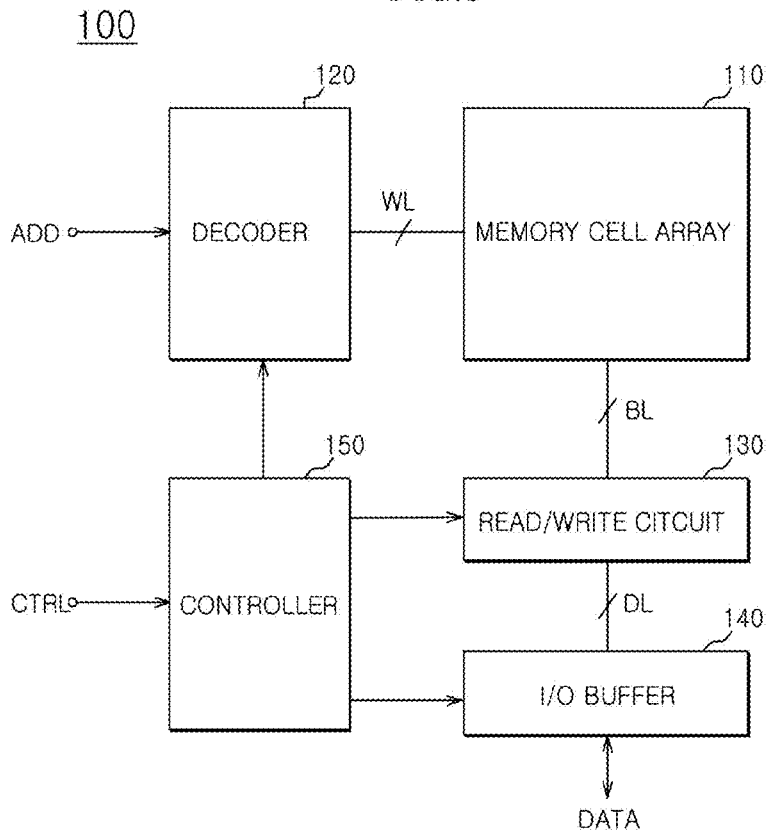
FIG. 9 is a view illustrating a configuration of a memory apparatus according to an exemplary embodiment.

FIG. 9 is a view illustrating a configuration of a memory apparatus according to an exemplary embodiment.

Referring to FIG. 9, a memory apparatus 100 according to an exemplary embodiment includes a memory cell array 110, a decoder 120, a read/write circuit 130, an input/output (I/O) buffer 140, and a controller 150.

Each of a plurality of memory cells constituting a memory cell array 100 may adopt any one of the structures of the resistance memory devices illustrated in FIGS. 2 to 6, but the memory cell is not limited thereto. The memory cell may include (i) a stack of at least one variable resistance material layer and a piezoelectric material layer disposed on at least one side of the at least one variable resistance material layer and (ii) a pair of electrode layers. The stack is formed between the pair of electrode layers. Further, the plurality of memory cells in the memory cell array 110 are connected to the decoder 120 through a word line WL and to a read/write circuit 130 through a bit line BL.

The decoder 120 receives an external address signal ADD, decodes a row address signal and a column address signal, and transmits the row address signal and the column address signal into the memory cell array 100 under control of the controller 150 which is configured to operate in response to a control signal CTRL.

The read/write circuit 130 receives data DATA from an I/O buffer 140 and write the data in a selected memory cell of the memory cell array 110 under control of the controller 150, or provide data read from a selected memory cell of the memory cell array 110 to the I/O buffer 140 under control of the controller 150.

Figure 10:
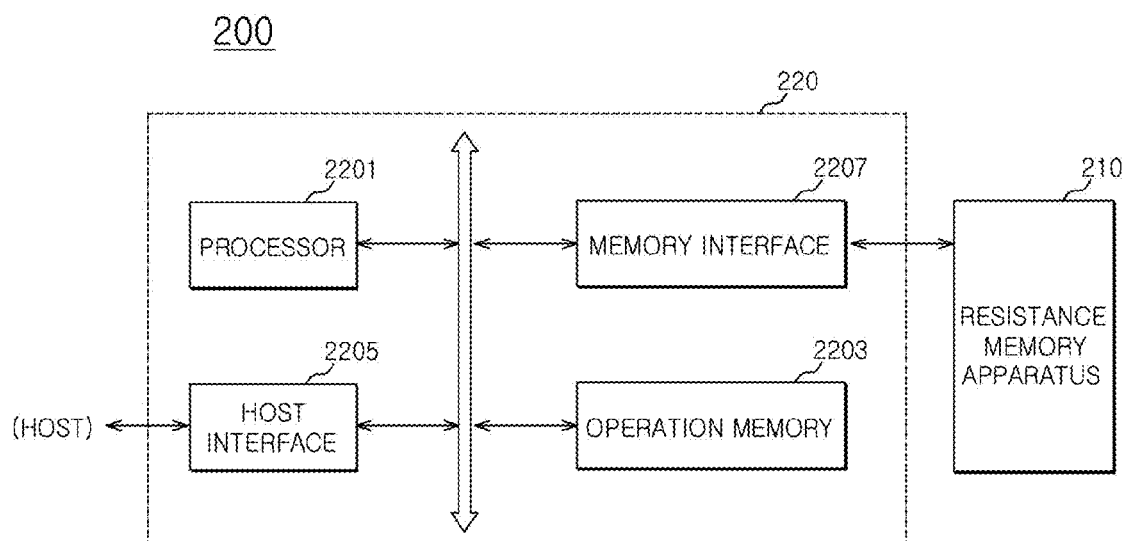
FIG. 10 is a view illustrating a configuration of a data processing system according to an exemplary embodiment.

FIG. 10 is a view illustrating a configuration of a data processing system according to an exemplary embodiment.

A data processing system 200 illustrated in FIG. 10 may include a memory controller 220 connected between a host and a resistance memory apparatus 210.

The memory controller 220 may be configured to access the resistance memory apparatus 210 in response to demand of the host and may include a processor 2201, an operation memory 2203, a host interface 2205, and a memory interface 2207.

The processor 2201 may control an overall operation of the memory controller 220 and the operation memory 2203 may store an application, data, a control signal, and the like which is used for an operation of the memory controller 220.

The host interface 2205 performs protocol conversion for exchanging data and a control signal between the host and the memory controller 220 and the memory interface 2207 perform protocol conversion for exchanging data and a control signal between the memory controller 220 and the resistance memory apparatus 210.

The resistance memory apparatus 210 may adopt a memory device having a structure in which at least one variable resistance material layer and a piezoelectric material layer disposed on at least one side of the at least one variable resistance material layer are formed between a pair of electrode layers as a unit memory cell, and for example, may include a memory device having a structure selected from the structures illustrated in FIGS. 2 to 6.

In an exemplary embodiment, the data processing system illustrated in FIG. 10 may be a memory card, but the data processing system is not limited thereto.

Figure 11:
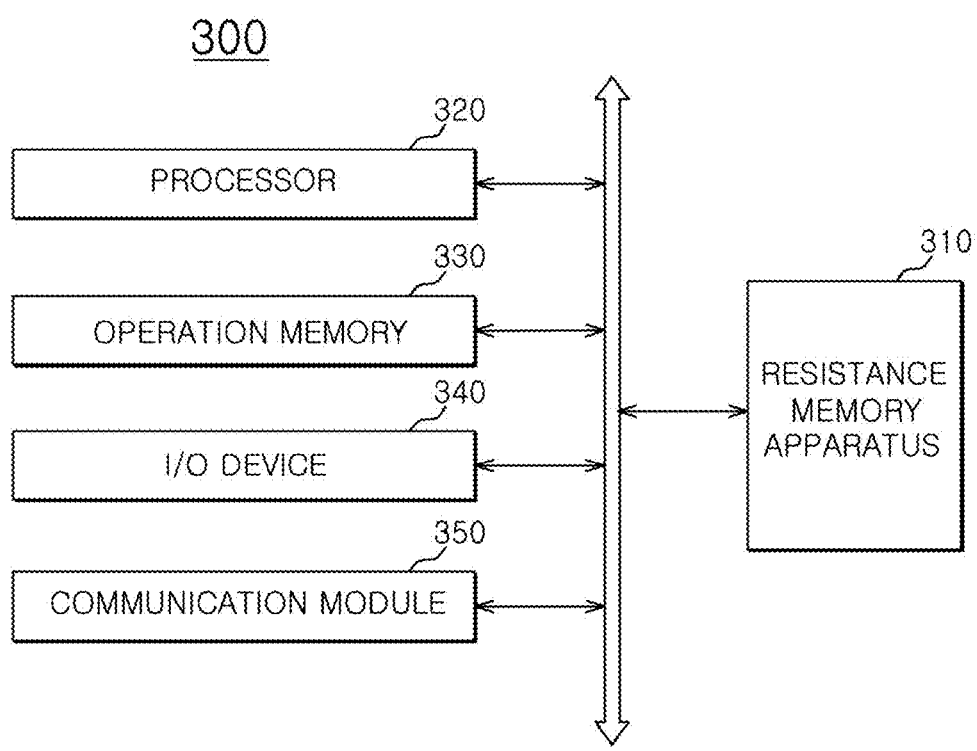
FIG. 11 is a view illustrating a configuration of a data processing system according to another exemplary embodiment.

FIG. 11 is a view illustrating a configuration of a data processing system according to another exemplary embodiment.

A data processing system 300 illustrated in FIG. 11 includes a resistance memory apparatus 310, a processor 320, an operation memory 330, and an I/O device 340. If necessary, the data processing system 300 may further include a communication module 350.

The processor 320 may be a central processing unit (CPU), and the operation memory 330 may store an application program, data, and a control signal required for an operation of the data processing system 300. The I/O device 340 provides an environment in which a user accesses the data processing system 300 and provides data processing process, result, and the like of the data processing system 300 to the user.

The resistance memory apparatus 310 may adopt a memory device having a structure in which at least one variable resistance material layer and a piezoelectric material layer disposed on at least one side of the at least one variable resistance material layer are formed between a pair of electrode layers as a unit memory cell, and for example, may include a memory device having a structure selected from the structures illustrated in FIGS. 2 to 6.

The data processing systems illustrated in FIGS. 10 and 11 may be used as a disc apparatus, an embedded or external memory card of a portable electronic apparatus, or an image processor and other application chipsets.

The above embodiment is illustrative and not limitative. Various alternatives are possible. Embodiments are not limited by the specific examples described herein. Nor are embodiments limited to any specific type of semiconductor device. Other additions, subtractions, or modifications available within the scope of the appended claims.

What is claimed is:

1. A resistance memory device, comprising:
   a pair of electrode layers; and
   a variable resistance layer interposed between the pair of electrode layers,
   wherein the variable resistance layer includes a first variable resistance layer, a second variable resistance layer, and a third variable resistance layer,
   wherein the second variable resistance layer includes a stack of a piezoelectric material layer and a variable resistance material layer, and
   wherein the first and the third variable resistance layers include variable resistance materials but do not include a piezoelectric material.

2. The resistance memory device of claim 1, wherein the piezoelectric material layer includes a material non-reactive with the variable resistance material layer.

3. The resistance memory device of claim 1, wherein the piezoelectric material layer includes a Perovskite-based material.

4. The resistance memory device of claim 1, wherein the piezoelectric material layer includes a ferroelectric piezoelectric material.

5. The resistance memory device of claim 1, wherein the piezoelectric material layer is configured so that contraction occurs in the variable resistance material layer at an interface between the variable resistance material layer and the piezoelectric material layer when current is applied to the piezoelectric material layer.

6. A resistance memory apparatus, comprising:
   a memory cell array including a plurality of memory cells connected between word lines and bit lines; and
   a controller configured to control data write/read operation for a selected memory cell of the memory cell array,
   wherein the plurality of memory cells includes resistance memory devices, and
   wherein one or more of the resistance memory devices includes:
      a pair of electrode layers; and
      a variable resistance layer interposed between the pair of electrode layers,
         wherein the variable resistance layer includes a first variable resistance layer, a second variable resistance layer, and a third variable resistance layer,
      wherein the second variable resistance layer includes a stack of a piezoelectric material layer and a variable resistance material layer, and
      wherein the first and the third variable resistance layers include variable resistance materials but do not include a piezoelectric material.

7. The resistance memory apparatus of claim 6, wherein the piezoelectric material layer includes a material non-reactive with the variable resistance material layer.

8. The resistance memory apparatus of claim 6, wherein the piezoelectric material layer is configured so that contraction occurs in the variable resistance material layer at an interface between the variable resistance material layer and the piezoelectric material layer when current is applied to the piezoelectric material layer.

9. The resistance memory apparatus of claim 6, wherein each of the plurality of memory cells further includes a selection device electrically connected to one of the pair of electrode layers.

10. The resistance memory apparatus of claim 6, wherein the resistance memory devices are symmetrically disposed with respect to a corresponding bit line.

11. The resistance memory apparatus of claim 6, wherein:
   the resistance memory devices share an electrode layer; and
   the shared electrode layer is connected to the resistance memory devices through bit lines.

12. A data processing system, comprising:
   a resistance memory apparatus; and
   a memory controller configured to access the resistance memory apparatus in response to demand of a host, wherein the resistance memory apparatus includes a memory cell array and a controller configured to control an operation of the memory cell array, wherein the memory cell array includes a plurality of memory cells, wherein the plurality of memory cells are connected between word lines and bit lines, each of the plurality of memory cells including a resistance memory device, wherein each resistance memory device includes a pair of electrode layers and a variable resistance layer interposed between the pair of electrode layers, and wherein the variable resistance layer includes a stacked structure of a first piezoelectric material layer, a variable resistance material layer, and a second piezoelectric material layer.

13. The data processing system of claim 12, wherein the first and second piezoelectric material layers include a material non-reactive with the variable resistance material layer.

14. The data processing system of claim 12, wherein the first and second piezoelectric material layers are configured so that contraction occurs in the variable resistance material layer at an interface between the variable resistance material layer and a corresponding one of the first and second piezoelectric material layers when current is applied to the corresponding piezoelectric material layer.

15. A resistance memory device, comprising:
a pair of electrode layers; and
a variable resistance layer interposed between the pair of electrode layers,
wherein the variable resistance layer includes a stacked structure of a first piezoelectric material layer, a variable resistance material layer, and a second piezoelectric material layer.

16. The resistance memory device of claim 15, wherein the first piezoelectric material layer and the second piezoelectric material layer include a material non-reactive with the variable resistance material layer.

17. The resistance memory device of claim 15, wherein the first piezoelectric material layer and the second piezoelectric material layer include a Perovskite-based material.

18. The resistance memory device of claim 15, wherein the first piezoelectric material layer and the second piezoelectric material layer include a ferroelectric piezoelectric material.

19. The resistance memory device of claim 15, wherein the first piezoelectric material layer and the second piezoelectric material layer are configured so that contraction occurs in the variable resistance material layer at an interface between the variable resistance material layer and a corresponding one of the first and second piezoelectric material layers when current is applied to the corresponding piezoelectric material layer.

* * * * *